WITNESSES
Edwin E. Bassler
Myron E. Click

INVENTOR
John L. Boyer
BY F. E. Browder
ATTORNEY

Oct. 27, 1959 J. L. BOYER 2,910,641

CONTROL CIRCUITRY

Filed Jan. 30, 1958 4 Sheets-Sheet 2

Oct. 27, 1959 J. L. BOYER 2,910,641

CONTROL CIRCUITRY

Filed Jan. 30, 1958 4 Sheets-Sheet 3

United States Patent Office 2,910,641

Patented Oct. 27, 1959

2,910,641

CONTROL CIRCUITRY

John L. Boyer, Forest Hills, Pa., assignor to Westinghouse Electric Corporation, East Pittsburgh, Pa., a corporation of Pennsylvania Application January 30, 1958, Serial No. 712,165

8 Claims. (Cl. 321—66)

This invention relates to control circuits in general and in particular to control circuits for frequency converters.

There are a number of applications which require direct-current power with a short period of reverse polarity or which require low frequency symmetrical alternating-current power, but until recently, there has not been any good practical method to obtain this power at a low voltage. The development of heavy current transistors and hyperconductive negative resistance diodes has now made it possible to design power circuits which will meet the requirements for applications such as reverse pulse electroplating and low frequency welding.

A semiconductor diode utilized in this invention has such characteristics that on exceeding certain specified reverse current and voltage, the diode becomes highly conductive and thereafter will carry a substantial reverse current at low voltages. This phenomenon is not a Zener breakdown nor is it an avalanche breakdown. This unique breakdown characteristic can be repeated indefinitely. This breakdown has been designated as hyperconductive breakdown and a diode having such characteristic will be referred hereinafter as a hyperconductive diode.

Such a hyperconductive diode with controllable reversible breakdown characteristics or hyperconductive breakdown may comprise a first base element which consists of a semiconductor member doped with an impurity to provide a first type of semiconductivity, either N or P. Upon this first base element is an emitter element consisting of semiconductor material doped with the opposite type of semiconductivity. This emitter element may be prepared by alloying a pellet containing a doping impurity to a wafer of semiconductor material forming the first base element. An emitter junction is present at the zone between the first base element and the emitter element.

In order to facilitate the connecting of the diode into an electrical circuit, a layer of silver or other good conductor element may be fused, alloyed into or soldered with the upper surface of the emitter. Copper lead wires may be readily soldered to this layer.

A second base element of opposite conductivity is provided next to the first base element. A zone where the first and second base element meet forms a collector junction.

Next to the second base element is a mass-of-metal which is a source of carriers that play a critical part in the functioning of the hyperconductive diode. This mass-of-metal may be neutral or it may have the same characteristics as the second base element. The mass-of-metal may be applied to the second base by soldering, alloying, fusing or other similar well-known method.

Such a hyperconductive semiconductor diode is described in a copending application Serial No. 642,743, entitled "Semiconductor Diode," filed February 27, 1957, and assigned to the same assignee as the present invention. For a more detailed description of the construction, characteristics and operation of such a hyperconductive diode, reference is made to the aforementioned copending application, Serial No. 642,743.

The heavy current transistors to be utilized in this invention are of the three-electrode type wherein the power circuit is connected between two of said electrodes and a circuit for controlling conduction through the said two electrodes is connected between the third electrode and one of the said two electrodes.

It is an object of this invention to provide an improved control circuit for frequency converters.

It is another object of this invention to provide an improved control circuit for frequency converters which utilize controlled semiconductor rectifier elements.

It is still another object of this invention to provide an improved control circuit for frequency converters utilizing controlled semiconductor rectifier elements wherein a pulsed release of one rectifier element sets up certain conditions which determines the rectifier element to be released next so that a predetermined pattern of rectifier element releases is established.

Further objects of this invention will become obvious when the following description is taken in conjunction with the accompanying drawings. In said drawings, for illustrative purposes only, there are shown preferred embodiments of this invention.

Figure 1:
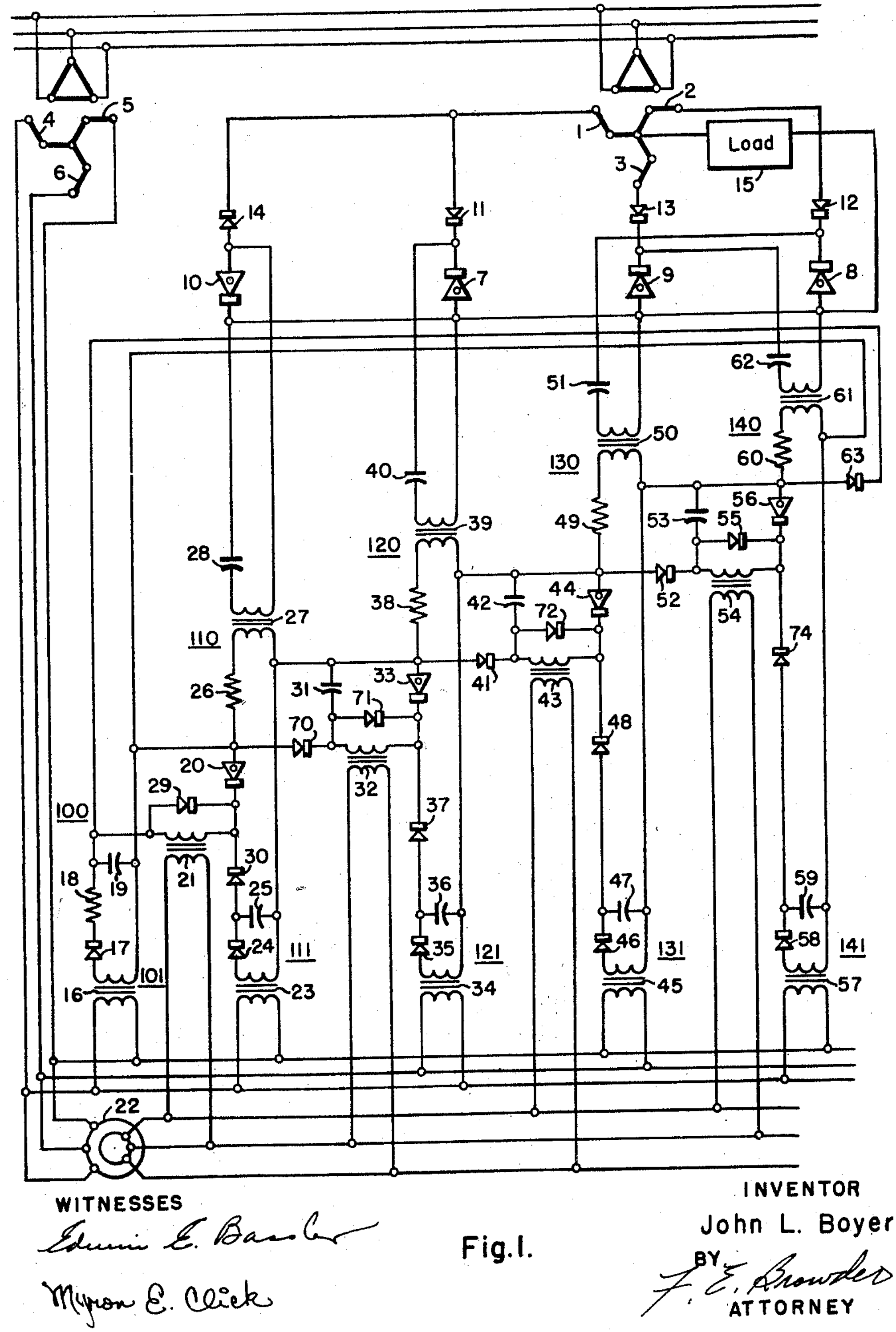
Figure 1 is a schematic diagram of an improved control circuit for frequency converters embodying the teachings of this invention.

Referring to Fig. 1, there is illustrated a complete power circuit and an improved control circuit for a frequency converter which utilizes hyperconductive negative resistance diodes to obtain a controlled direct-current output which has a reverse pulse every two cycles of the input frequency. Such a circuit may be utilized for certain applications of reverse pulse electroplating.

Figure 2:
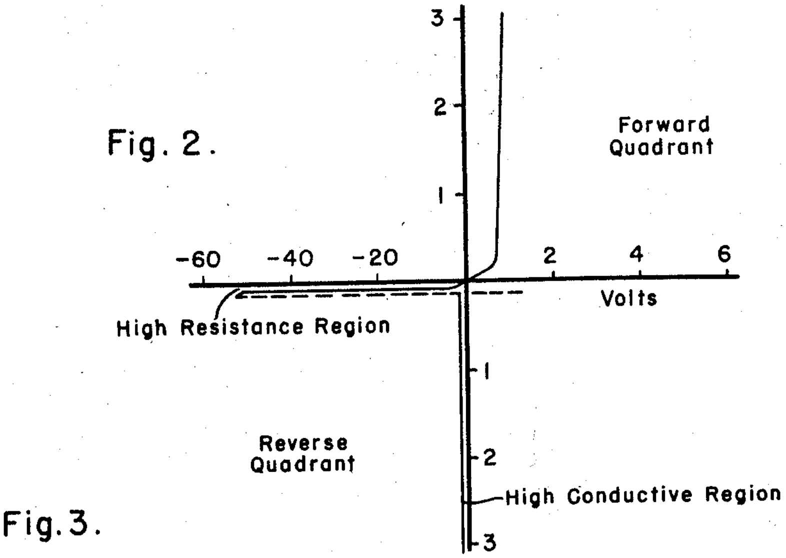
Fig. 2 is a graphical representation of the operating characteristic of the controlled semiconductor rectifier element in the apparatus illustrated in Fig. 1.

Referring to Fig. 2, the curve shows how the hyperconductive diode utilized in Fig. 1 responds to the application of different voltages. Considering the upper right or forward quadrant, when a forward voltage of the order of one voltage unit is applied, the current builds up to approximately three current units. When the voltage is reversed, it builds up in the reverse direction to approximately fifty-five voltage units with only a small fraction of a current unit of current flowing, and then the hyperconductive diode suddenly becomes hyperconductive and the voltage drops to about one voltage unit as shown in the lower left or reverse quadrant. Thus the diode becomes a conductor with low ohmic resistance and the current builds up rapidly to several current units.

As shown in the reverse quadrant when the hyperconductive diode breaks down the voltage drops along a substantially straight line to approximately one voltage unit and very little power is dissipated in maintaining the diode hyperconductive. The diode can be rendered highly resistant again by reducing the current below a minimum threshold value and the voltage below breakdown value. Consequently, the curve may be repeatedly followed as desired by properly controlling the magnitude of the reverse current and voltage.

Referring again to Fig. 1, there is illustrated four power hyperconductive diodes 7, 8, 9 and 10 which are fed through rectifiers 11, 12, 13 and 14 from a zig-zag power transformer 1, 2 and 3. A load 15 is connected between neutral of the zig-zag transformer 1, 2 and 3 and the common output terminal of the power hyperconductive diodes 7, 8, 9 and 10.

The control circuit comprises an external starting circuit 100 which sets the conditions for the operation of the power hyperconductive diodes 7, 8, 9 and 10 by the pulse circuits 110, 120, 130 and 140, respectively.

The external starting circuit 100 comprises an energy storing circuit 101 and impulse transformer 21. The energy storing circuit 101 comprises a transformer 16 which has its primary winding connected to a first phase of the input or line voltage. The secondary winding of the transformer 16 is serially connected with a rectifier means 17, a current limiting resistance 18, and a capacitive means 19. The capacitive means 19 is connected across a hyperconductive diode 20 of the pulse circuit 110 through the secondary winding of an impulse transformer 21. The primary winding of the impulse transformer 21 is connected across a first phase of the input or line voltage after the input voltage has been fed through a phase shifter 22. A rectifier 29 is connected across a secondary winding of the impulse transformer 21 in order to cancel the inverse voltage pulse of the peaking or impulse transformer 21.

The pulse circuit 110 comprises an energy storing circuit 111, the hyperconductive diode 20, a coupling transformer 27, and an impulse transformer 32. The energy storing circuit 111 comprises a transformer 23, having its primary winding connected across the first phase of the input voltage and its secondary winding serially connected with the rectifier means 24 and a capacitive means 25. The capacitive means 25 is connected in series circuit relationship with a rectifier means 30, the hyperconductive diode 20, a current limiting resistor 26 and the primary winding of the coupling transformer 27. The capacitive means 25 is also serially connected with the rectifier means 30, the hyperconductive diode 20, a rectifier means 70, a secondary winding of an impulse or peaking transformer 32 and a hyperconductive diode 33 of the pulse circuit 120. The primary winding of the peaking transformer 32 is connected to a second phase of the input voltage after the input voltage has been fed through the phase shifter 22. A rectifier means 71 is connected across the secondary winding of the peaking transformer 32. A capacitor 31 is connected across the secondary winding of the peaking transformer 32 and the hyperconductive diode 33. The secondary winding of the coupling transformer 27 is serially connected with the power hyperconductive diode 10 and a capacitive means 28.

The pulse circuit 120 comprises an energy storing circuit 121, the hyperconductive diode 33, a coupling transformer 39 and a peaking transformer 43. The energy storing circuit 121 comprises a transformer 34 having its primary winding connected across a second phase of the input voltage and a secondary winding which is serially connected with a rectifier means 35 and a capacitive means 36. The capacitive means 36 is serially connected with a rectifier means 37, the hyperconductive diode 33, a current limiting resistor 38 and a primary winding of the coupling transformer 39. The capacitive means 36 is also serially connected with the rectifier means 37, the hyperconductive diode 33, a rectifier means 41, a secondary winding of the inter-pulse circuit impulse or peaking transformer 43 and a hyperconductive diode 44 of the pulse circuit 130. A capacitive means 42 is connected across the secondary winding of the peaking transformer 43 and the hyperconductive diode 44. A rectifier means 72 is connected across the secondary winding of the peaking transformer 43 to cancel the inverse voltage pulse of the peaking transformer 43. The secondary winding of the coupling transformer 39 is serially connected with a capacitive means 40 and the power hyperconductive diode 7. The primary winding of the peaking transformer 43 is connected across a third phase of the input voltage after it has been fed through the phase shifter 22.

The pulse circuit 130 comprises an energy storing circuit 131, the hyperconductive diode 44, a coupling transformer 50 and a peaking transformer 54. The energy storing circuit 131 comprises a transformer 45 having a primary winding connected across a third phase of the input voltage and a secondary winding which is serially connected with a rectifier means 46 and a capacitive means 47. The capacitive means 47 is serially connected with a rectifier means 48, the hyperconductive diode 44, a current limiting resistance 49, and a primary winding of the coupling transformer 50. The capacitive means 47 is also serially connected with the rectifier means 48, the hyperconductive means 44, the rectifier means 52, a secondary winding of the inter-pulse circuit impulse or peaking transformer 54, and a hyperconductive diode 56 of the pulse circuit 140. The primary winding of the peaking transformer 54 is connected to the first phase of an input voltage after it has been fed through the phase shifter 22. A capacitive means 53 is connected across the hyperconductive diode 56 and the secondary winding of the peaking transformer 54. The rectifier 55 is connected across the secondary winding of the peaking transformer 54 in order to cancel the inverse voltage pulse of the peaking transformer 54. The secondary winding of the coupling transformer 50 is serially connected with a capacitive means 51 and the power hyperconductive diode 8.

The pulse circuit 140 comprises an energy storing circuit 141, the hyperconductive diode 56 and a coupling transformer 61. The energy storing circuit 141 comprises a transformer 57 having its primary winding connected across the first phase of the input voltage and its secondary winding serially connected with a rectifier means 58 and a capacitive means 59. The capacitive means 59 is serially connected with a rectifier means 74, the hyperconductive diode 56, a current limiting resistor 60 and a primary winding of the coupling transformer 61. The secondary winding of the coupling transformer 61 is serially connected with a capacitive means 62 and the power hyperconductive diode 9. The capacitive means 59 is also serially connected to the rectifier means 74, the hyperconductive diode 56, a rectifier 63 and the capacitive means 19 in the external starting circuit 100.

The value of the resistance 18 is made sufficient so that several cycles of the input voltage are required before the voltage on the capacitor 19 has been built up to about the peak voltage of the secondary of the transformer 16. The voltage thus built up on the capacitor 19 is never high enough to cause hyperconductive breakdown of the hyperconductive diode 20 until it is added to the voltage of the peaking transformer at the correct firing angle. The voltage of the peaking transformer 21 also is never high enough itself to break down the hyperconductive diode 20 without the charge of voltage on the capacitor 19. The angle of release of the hyperconductive diode 20 is determined by the phase shifter 22.

Once the hyperconductive diode 20 has been driven to hyperconductive breakdown by a high frequency pulse on the primary of the peaking transformer 21, the capacitor 25 which has already been charged by the transformer 23 and rectifier 24 is able to discharge through the coupling transformer 27.

A high voltage pulse is thereby placed through the coupling transformer 27 on the power hyperconductive diode 10 and the capacitor 28. The capacitor 28 has a low impedance since its only purpose is to keep direct currents out of the coupling transformer 27 and therefore most of the voltage from the coupling transformer 27 appears across the power hyperconductive diode 10. The voltage across the power hyperconductive diode 10 causes hyperconductive breakdown which releases the hyperconductive diode 10 and allows the conduction of main power current to the load 15 in the reverse direction.

The releasing of the control hyperconductive diode 20 also places a complete charge on a capacitor 31 which, when added to the voltage of the peaking transformer 32 at the correct phase angle, pulses the control hyperconductive diode 33. The control hyperconductive diode 33 breaks down and allows the capacitive means 36 to discharge through the primary winding of the coupling transformer 39. The coupling transformer 39 places this voltage pulse across the capacitive means 40 and the power hyperconductive diode 7. Again the impedance of the capacitor 40 is low and most of the voltage appears across the diode 7 thereby causing breakdown of the diode 7 and allowing main power current to flow through the load 15 in the forward direction.

The control circuits 130 and 140 break down the power hyperconductive diodes 8 and 9, respectively, in an identical fashion as their respective peaking transformers 43 and 54 receive pulses from the phase shifter 22. The breakdown of the control hyperconductive diode 56 in the pulse circuit 140 not only breaks down the power hyperconductive diode 9 but also feeds back a pulse through the rectifier 63 to the capacitor 91 in the external starting circuit 100 which restarts the chain of events by charging the capacitor 19.

Figure 3:
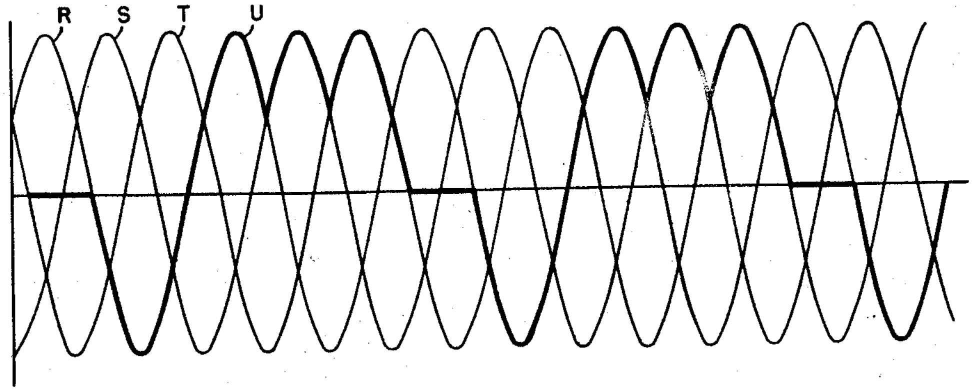
Fig. 3 is a graphical representation of the waveforms at selected points of the apparatus of Fig. 1.

Referring to Fig. 3 the power output voltage waveform of the apparatus illustrated in Fig. 1 is shown. The light lines R, S, T designate the input voltage to the zig-zag transformers 1, 2 and 3 and the single heavy line U denotes the output voltage to the load 15. That is, three phases are shown firing in the forward direction and one phase in the reverse direction.

Figure 4:
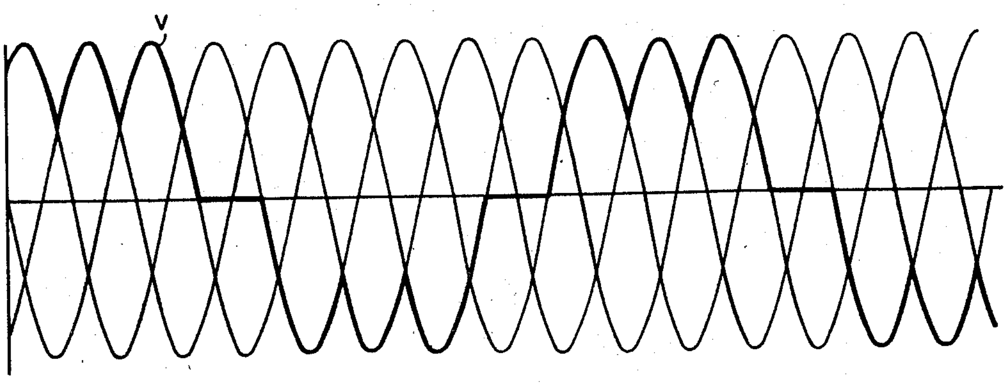
Fig. 4 is a graphical representation of waveforms to be obtained from a second embodiment of this invention.

As may be readily seen various combinations of the external starting circuit 100 and the pulse circuits 110, 120, 130 and 140 may be used to obtain different waveforms. For example, in Fig. 4 a symmetrical alternating-current output waveform V is shown which may be obtained by having six power hyperconductive diodes on a three-phase circuit with three in a forward direction and three in a reverse direction. The pulse circuits are then connected so as to go through phases 1, 2 and 3 in the forward direction and then through phases 1, 2 and 3 in the reverse direction before starting over. In addition, the firing angle of all the hyperconductive diodes may be charged in order to control the ratio between the forward voltages and the reverse voltages.

Figure 5:
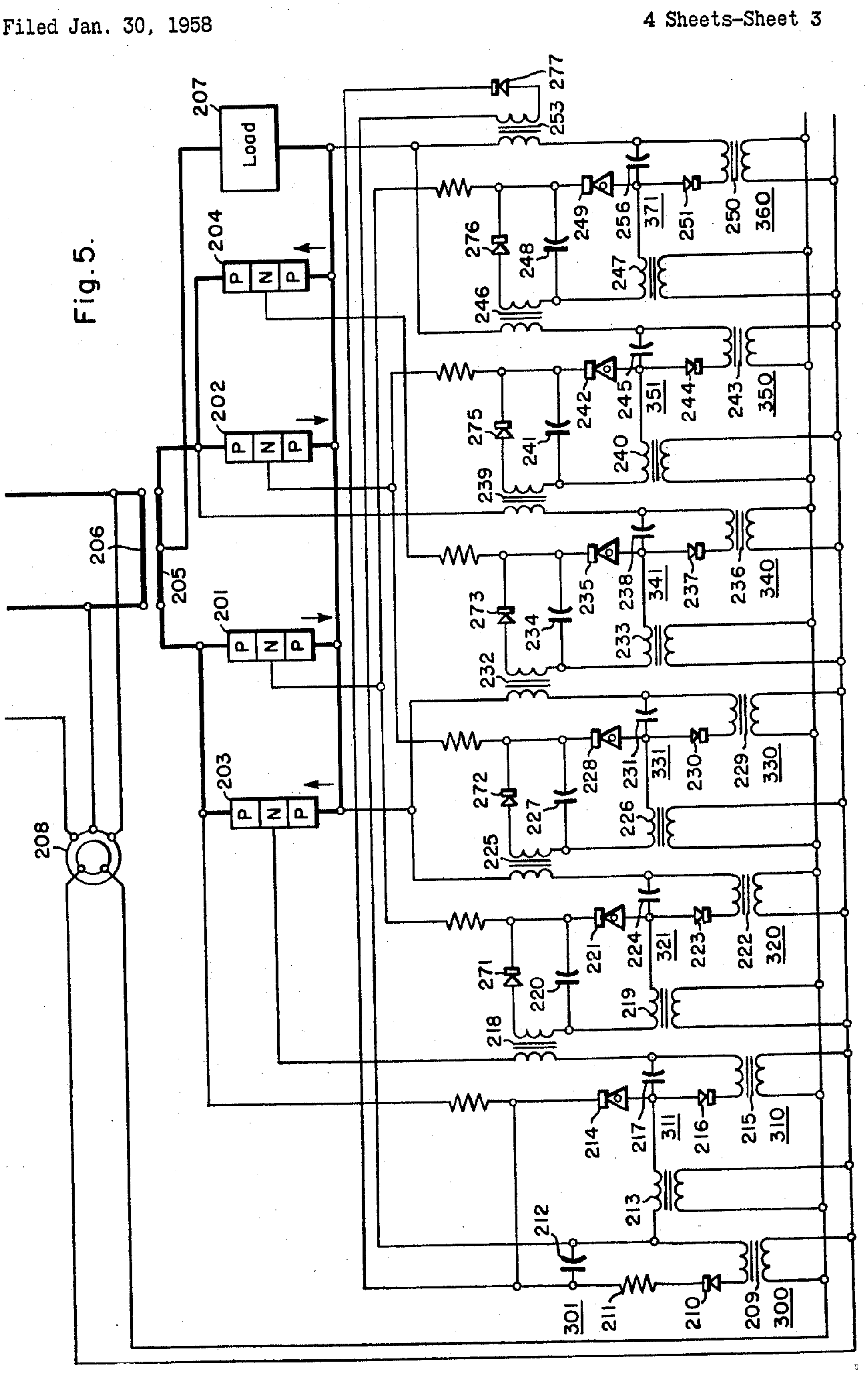
Fig. 5 is a schematic diagram of a third embodiment of the teachings of this invention.

Referring to Fig. 5, there is illustrated a single phase reverse pulse circuit whose power circuit elements are three electrode transistors and whose control circuit elements are hyperconductive diodes. The power circuit in Fig. 5 comprises the three electrode power transistors 201, 203 and 202, 204 connected in two parallel branches on the leads of a power transformer 205. A load 207 is connected between the center tap of the power transformer 205 and the common output terminal of the transistors 201, 202, 203 and 204. The power transistors 201, 202, 203 and 204 are of the three electrode type. Two of the three electrodes are connected in the power circuit. Conduction between these two electrodes is controlled by the polarity of a current applied between the third electrode and one of the said two electrodes. In this embodiment of the invention one external starting circuit 300 is employed in conjunction with six pulse circuits 310, 320, 330, 340, 350 and 360 which at various times allow or cause conduction through the transistors 201, 202, 203 and 204 by the impression of a pulse of the proper magnitude between the third electrode and one of the two power electrodes.

The external starting circuit 300 comprises an energy storing circuit 301 and a peaking transformer 213. The energy storing circuit 301 comprises a transformer 209 having its primary connected to the phase shifter 208 which is in turn connected to the input voltage. The secondary of the transformer 209 is serially connected with the rectifier means 210, a resistance 211 and a capacitor 212. The capacitor 212 is serially connected with a secondary winding of the peaking transformer 213 and a hyperconductive diode 214 of the pulse circuit 310.

The pulse circuit 310 comprises an energy storing circuit 311, an inter-pulse circuit coupling transformer 218 and a peaking transformer 219. The energy storing circuit 311 comprises a transformer 215 having its primary winding connected to the output of the phase shifter 208 and a secondary winding serially connected with a rectifier means 216 and a capacitive means 217. A primary winding of the transformer 218, the capacitive means 217 and the hyperconductive diode 214 are serially connected between one power electrode and a control electrode of the power transistor 203. A secondary winding of the transformer 218 is serially connected with a rectifying means 271, a hyperconductive diode 221 of the pulse circuit 320 and a secondary winding of the peaking transformer 219. A capacitive means 220 is connected across the rectifier 271 and the secondary winding of the transformer 218. The primary of the peaking transformer 219 is connected to the output of the phase shifter 208.

The pulse circuit 320 comprises an energy storing circuit 321, an inter-pulse circuit coupling transformer 225 and a peaking transformer 226. The energy storing circuit 321 comprises a transformer 222 having its primary winding connected to the output of the phase shifter 208 and the secondary winding serially connected with a rectifier 223 and a capacitive means 224. The hyperconductive diode 221, the capacitive means 224, and the primary winding of the coupling transformer 225 are serially connected between the control electrode and a power electrode of the power transistor 201. The secondary winding of the transformer 225 is serially connected with a rectifier 272, a hyperconductive diode 228 of the pulse circuit 330 and the secondary winding of the peaking transformer 226. The capacitive means 227 is connected across the rectifier 272 and the secondary winding of the transformer 225.

The pulse circuit 330 comprises an energy storing circuit 331, an inter-pulse circuit coupling transformer 222 and a peaking transformer 233. The energy storing circuit 331 comprises a transformer 229 having its primary winding connected to the output of the phase shifter 208 and its secondary winding serially connected with a rectifier 230 and a capacitive means 231. The hyperconductive diode 228, the capacitive means 231 and a primary winding of an inter-pulse circuit coupling transformer 232 are connected in series circuit relationship with the control and the power electrode of the transistor 202. The secondary winding of the transformer 232 is serially connected with a rectifier 273, a hyperconductive diode 235 of the pulse circuit 340 and a secondary winding of the peaking transformer 233. A capacitive means 234 is connected across the rectifier 273 and the secondary winding of the transformer 232. The primary winding of the peaking transformer 233 is connected to the output of the phase shifter 208.

The pulse circuit 340 comprises an energy storing circuit 341, an inter-pulse circuit coupling transformer 239 and the peaking transformer 240. The energy storing circuit 341 comprises a transformer 236 having its primary winding connected to the phase shifter 208 and its secondary winding serially connected with a rectifier 237 and a capacitive means 238. The hyperconductive diode 235, the capacitive means 238 and a primary winding of the transformer 239 are connected in series circuit relationship between the control electrode and the power electrode of the transistor 204. A secondary winding of transformer 239 is serially connected with a rectifier 275, a hyperconductive diode 242 of the pulse circuit 350 and a secondary winding of the peaking transformer 240. A capacitive means 241 is connected across the rectifier 275 and the secondary winding of the transformer 239. The primary winding of the peaking transformer 240 is connected to the output of the phase shifter 208.

The pulse circuit 350 comprises an energy storing circuit 351, an inter-pulse circuit coupling transformer 246 and a peaking transformer 247. The energy storing circuit 351 comprises a transformer 343 having its primary winding connected to the output of the phase shifter 208 and its secondary winding serially connected with a rectifier 244 and a capacitive means 245. The hyperconductive diode 242, the capacitive means 245 and the primary winding of the transformer 246 are serially connected between the control electrode and a power electrode of the transistor 202. The secondary winding of the transformer 246 is serially connected with a rectifier 276, a hyperconductive diode 249 of the pulse circuit 360 and a secondary winding of the peaking transformer 247. A capacitive means 248 is connected across the rectifier 276 and the secondary winding of the winding 246. The primary winding of the transformer 247 is connected to the output phase shifter 208.

The pulse circuit 360 comprises an energy storing circuit 361 and a feedback transformer 253. The energy storing circuit 361 comprises a transformer 250 having its primary winding connected to the output of the phase shifter 208 and its secondary winding serially connected with a rectifier 251 and a capacitive means 272. The hyperconductive diode 249, the capacitive means 252 and a primary winding of the transformer 253 are serially connected between a control electrode of the transistor 201 and a power electrode of the transistor 201. The secondary of the feedback transformer 253 is connected serially with a rectifier 277 and the capacitance 212 of the external starting circuit 300.

The apparatus illustrated in Fig. 5 operates on the same principles as that described for Fig. 1 except for pulses of current released to the power transistors 201, 202, 203 and 204 instead of pulses of voltage as shown in Fig. 1. The inter-pulse circuit coupling transformers 218, 225, 232, 239, 246 and 256 are used to change pulses of current into voltage pulses to set up conditions in the succeeding pulse circuit so that the succeeding pulse circuit will release at the correct time.

The energy storing circuit 301 of the external starting circuit 300 charges the capacitance 212. The charge across the capacitance 212 is insufficient to break down the hyperconductive diode 214 of the pulse circuit 310. However, the charge across the capacitance 212 plus the timed appearance of voltage on the secondary of the peaking transformer 213 will break down the hyperconductive diode 214 sending a pulse of current from the previously charged capacitance 217 causing conduction in the transistor 203. This pulse of current induces a voltage in the secondary of the transformer 218 which charges the capacitance 220. Again the charge on the capacitance 220 is insufficient to break down the hyperconductive diode 221 of the pulse circuit 320. However, the addition of the voltage from the peaking transformer 219 will break down the hyperconductive diode 221 and allow conduction in the transistor 201. Since the operation of the succeeding pulse circuits 330, 340, 350 and 360 is identical, a further description of said operation is deemed unnecessary. When the pulse circuit 370 is released it not only causes conduction through the transistor 201 but the current pulse feeds back from the transformer 253 a voltage pulse to charge the capacitance 212 of the external starting circuit 300 in order that the chain of events may start again.

Figure 6:
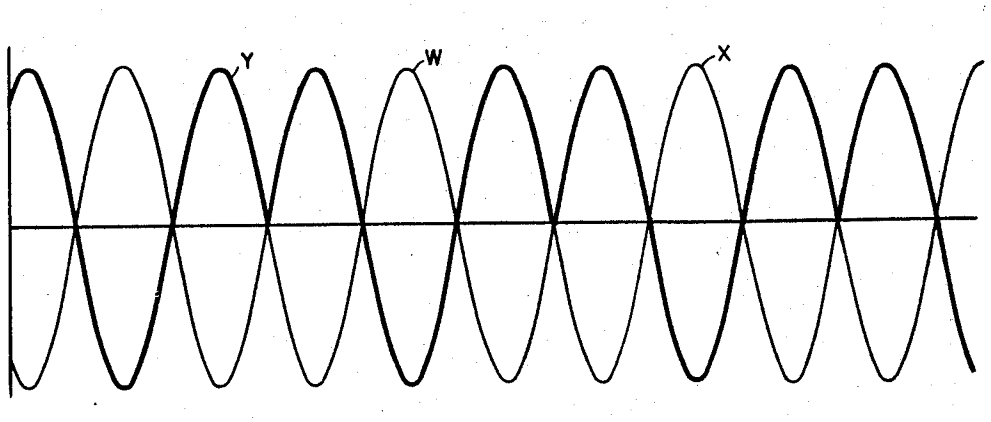
Fig. 6 is a graphical representation of the waveforms present at selected points of the apparatus illustrated in Fig. 5.

Referring to Fig. 6, there is shown the output voltage wave of the apparatus illustrated in Fig. 5. The light lines W and X indicate the output of the power transformer 205 while the heavy line Y indicates the voltage that is appearing across the load 207.

Figure 7:
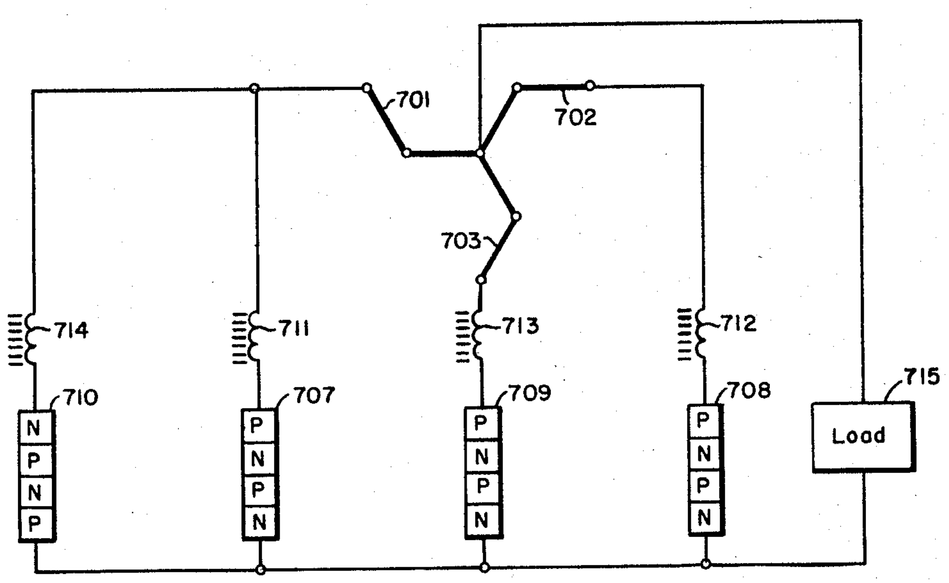
Fig. 7 is a schematic diagram of an alternate embodiment of a load circuit which may be utilized with this invention.

Referring to Fig. 7, there is illustrated a schematic diagram of an alternate type of load circuit embodying the teachings of this invention. Four power diodes 707, 708, 709 and 710 are fed through power reactors 711, 712, 713 and 714 from a zig-zag power transformer 701, 702, 703. A load 715 is connected between neutral of the zig-zag transformer 701, 702, 703 and each phase. The power reactors 711, 712, 713 and 714 make it possible to place pulses of voltage on the power diodes without pulsing the main power transformer. These reactors under normal conditions should be saturating reactors that will not greatly effect the flow of power current. Pulse circuits, as described hereinbefore, are to be placed across each power diode 707, 708, 709 and 710 to be fired in a manner and order as desired.

The diodes 707, 708, 709 and 710 are triggered to a hyperconductive state in the same manner as the power diodes of Fig. 1. However, their forward impedance characteristic is such that rectifiers such as those used in the load circuit of Fig. 1 need not be used and the saturable reactors 711, 712, 713 and 714 are used instead for reasons stated in the preceding paragraph. Such a diode is described in an article "The Four Layer Diode," by Dr. William Shockley, in Electronic Industries and Tele Tech, August 1957, pages 58–60, 161–165.

The apparatus hereinbefore described may be used where it is desired to have a constant pattern of output voltage waveform, but it is possible to use the same type of control circuits for a variable output of the waveform if the control circuits are reconnected to provide the desired pattern of power semiconductor element releasing. It is also possible to have a complete variable output by connecting the control pulse circuits in two groups and having a first group releasing the power semiconductor rectifier elements for forward conduction and having a second group release the power semiconductor rectifier elements for reverse conduction and then applying a square wave of voltage to the pulse circuit capacitor so that the two groups are 180° out of phase on the low frequency. By this means it is possible to obtain a low voltage, variable frequency, alternating-current power source.

In conclusion, it is pointed out that while the illustrated example constitutes practical embodiment of my invention, I do not limit myself to the exact details shown, since modification of the same may be varied without departing from the spirit and scope of this invention.

I claim as my invention:

1. In frequency converter apparatus; in combination; a power transformer having a polyphase secondary; at least one controlled semiconductor power rectifier element serially connected with means to which a load may be connected between each phase and a neutral of said polyphase secondary; a pulse circuit for each said power rectifier element; and a starting circuit; each said pulse circuit comprising an energy storage means serially connected with a hyperconductive diode and a coupling means; each said coupling means being connected to control the release of one of said power rectifier elements; each said energy storage means of each said pulse circuit being serially connected through an inter-pulse circuit impulse means across a hyperconductive diode of a succeeding pulse circuit; said starting circuit comprising an energy storage means serially connected with an impulse means across a hyperconductive diode of a first pulse circuit.

2. In frequency converter apparatus; in combination; a power transformer having a polyphase secondary; at least one controlled semiconductor power rectifier element serially connected with means to which a load may be connected between each phase and a neutral of said polyphase secondary; a pulse circuit for each said power rectifier element; and a starting circuit; each said pulse circuit comprising an energy storage means serially connected with a hyperconductive diode and a coupling means; each said coupling means being connected to control the release of one of said power rectifier elements; each said energy storage means of each said pulse circuit being serially connected through an inter-pulse circuit impulse means across a hyperconductive diode of a succeeding pulse circuit; said starting circuit comprising an energy storage means serially connected with an impulse means across a hyperconductive diode of a first pulse circuit; said energy storage means and said impulse means of said starting circuit cooperating to break down said hyperconductive diode of said first pulse circuit.

3. In frequency converter apparatus; in combination; a power transformer having a polyphase secondary; at least one controlled semiconductor power rectifier element serially connected with means to which a load may be connected between each phase and a neutral of said polyphase secondary; a pulse circuit for each said power rectifier element; and a starting circuit; each said pulse circuit comprising an energy storage means serially connected with a hyperconductive diode and a coupling means; each said coupling means being connected to control the release of one of said power rectifier elements; each said energy storage means of each said pulse circuit being serially connected through an inter-pulse circuit impulse means across a hyperconductive diode of a succeeding pulse circuit; said starting circuit comprising an energy storage means serially connected with an impulse means across a hyperconductive diode of a first pulse circuit; said energy storage means and said impulse means of said starting circuit cooperating to break down said hyperconductive diode of said first pulse circuit; the breakdown of a hyperconductive diode of a pulse circuit being operative through said coupling means to cause one of said power rectifier elements to conduct.

4. In frequency converter apparatus; in combination; a power transformer having a polyphase secondary; a controlled semiconductor power rectifier element serially connected with means to which a load may be connected between each phase and a neutral of said polyphase secondary; a pulse circuit for each said power rectifier element; and a starting circuit; each said pulse circuit comprising an energy storage means serially connected with a hyperconductive diode and a coupling means; each said coupling means being connected to control the release of one of said power rectifier elements; each said energy storage means of each said pulse circuit being serially connected through an inter-pulse circuit impulse means across a hyperconductive diode of a succeeding pulse circuit; said starting circuit comprising an energy storage means serially connected with an impulse means across a hyperconductive diode of a first pulse circuit; said energy storage means and said impulse means of said starting circuit cooperating to break down said hyperconductive diode of said first pulse circuit; the breakdown of a hyperconductive diode of a pulse circuit being operative through said coupling means to cause one of said power rectifier elements to conduct; the breakdown of a hyperconductive diode of a pulse circuit being operative in cooperation with an inter-pulse circuit impulse means to break down a hyperconductive diode of a succeeding pulse circuit.

5. In frequency converter apparatus; in combination; a power transformer having a polyphase secondary; a controlled semiconductor power rectifier element serially connected with means to which a load may be connected between each phase and a neutral of said polyphase secondary; a pulse circuit for each said power rectifier element; and a starting circuit; each said pulse circuit comprising an energy storage means serially connected with a hyperconductive diode and a coupling means; each said coupling means being connected to control the release of one of said power rectifier elements; each said energy storage means of each said pulse circuit being serially connected through an inter-pulse circuit impulse means across a hyperconductive diode of a succeeding pulse circuit; said starting circuit comprising an energy storage means serially connected with an impulse means across a hyperconductive diode of a first pulse circuit; said energy storage means and said impulse means of said starting circuit cooperating to break down said hyperconductive diode of said first pulse circuit; the breakdown of a hyperconductive diode of a pulse circuit being operative through said coupling means to cause one of said power rectifier elements to conduct; the breakdown of a hyperconductive diode of a pulse circuit being operative in cooperation with an inter-pulse circuit impulse means to break down a hyperconductive diode of a succeeding pulse circuit; the breakdown of a hyperconductive diode of a last pulse circuit being operative to allow, through feedback rectifier means, charging of said energy storage means of said starting circuit.

6. In frequency converter apparatus, in combination; a power transformer having a polyphase secondary; a controlled semiconductor power rectifier element and a power saturable reactor serially connected with means to which a load may be connected between each phase and a neutral of said polyphase secondary; a pulse circuit for each said power rectifier element; and a starting circuit; each said pulse circuit comprising an energy storage means serially connected with a hyperconductive diode and a coupling means; each of said coupling means being connected to control the release of one of said power rectifier elements; each said energy storage means of each said pulse circuit being serially connected through an inter-pulse circuit impulse means across a hyperconductive diode of a succeeding pulse circuit; said starting circuit comprising an energy storage means serially connected with an impulse means across a hyperconductive diode of a first pulse circuit; said energy storage means and said impulse means of said starting circuit cooperating to break down said hyperconductive diode of said first pulse circuit; the breakdown of a hyperconductive diode of a pulse circuit being operative through said coupling means to cause one of said power rectifier elements to conduct; the breakdown of a hyperconductive diode of a pulse circuit being operative in cooperation with an inter-pulse circuit impulse means to break down a hyperconductive diode of a succeeding pulse circuit; the breakdown of a hyperconductive diode of a last pulse circuit being operative to allow, through feedback rectifier means, charging of said energy storage means of said starting circuit.

7. In frequency converter apparatus, in combination; a power transformer having a polyphase secondary; a controlled semiconductor power rectifier element and a power saturable reactor serially connected with means to which a load may be connected between each phase and a neutral of said polyphase secondary; a pulse circuit for each said power rectifier element; and a starting circuit; each said pulse circuit comprising an energy storage means serially connected with a hyperconductive diode and a coupling means, each said coupling means being connected to control the release of one of said power rectifier elements; each said energy storage means of each said pulse circuit being serially connected through an inter-pulse circuit impulse means across a hyperconductive diode of a succeeding pulse circuit; said starting circuit comprising an energy storage means serially connected with an impulse means across a hyperconductive diode of a first pulse circuit; said energy storage means and said impulse means of said starting circuit cooperating to break down said hyperconductive diode of said first pulse circuit; the breakdown of a hyperconductive diode of a pulse circuit being operative through said coupling means to cause one of said power rectifier elements to conduct, the breakdown of a hyperconductive diode of a pulse circuit being operative in cooperation with an inter-pulse circuit impulse means to break down a hyperconductive diode of a succeeding pulse circuit; the breakdown of a hyperconductive diode of a last pulse circuit being operative to allow, through feedback rectifier means, charging of said energy storage means of said starting circuit; each said energy storage means and each said impulse means being of insufficient individual magnitude to break down said hyperconductive diodes.

8. In frequency converter apparatus, in combination; a power transformer having a polyphase secondary; a controlled semiconductor power rectifier element and a power saturable reactor serially connected with means to which a load may be connected between each phase and a neutral of said polyphase secondary; a pulse circuit for each said power rectifier element; and a starting circuit; each said pulse circuit comprising an energy storage means serially connected with a hyperconductive diode and a coupling means; each said coupling means being connected through a low impedance capacitive means to control the release of one of said power rectifier elements; each said energy storage means of each said pulse circuit being serially connected through an inter-pulse circuit impulse means across a hyperconductive diode of a succeeding pulse circuit; said starting circuit comprising an energy storage means serially connected with an impulse means across a hyperconductive diode of a first pulse circuit; said energy storage means and said impulse means of said starting circuit cooperating to break down said hyperconductive diode of said first pulse circuit; the breakdown of a hyperconductive diode of a pulse circuit being operative through said coupling means to cause one of said power rectifier elements to conduct; the breakdown of a hyperconductive diode of a pulse circuit being operative in cooperation with an inter-pulse circuit impulse means to break down a hyperconductive diode of a succeeding pulse circuit; the breakdown of a hyperconductive diode of a last pulse circuit being operative to allow, through feedback rectifier means, charging of said energy storage means of said starting circuit; each said energy storage means and each said impulse means being of insufficient individual magnitude to break down said hyperconductive diodes.

No references cited.